(12) United States Patent
Kirilenko et al.

(10) Patent No.: US 10,449,894 B2
(45) Date of Patent: Oct. 22, 2019

(54) DISPLAY DEVICE FOR DISPLAYING AT LEAST ONE SYMBOL, SWITCHING DEVICE, AND METHOD FOR MANUFACTURING A DISPLAY DEVICE

(71) Applicant: ZF Friedrichshafen AG, Friedrichshafen (DE)

(72) Inventors: Alexander Kirilenko, Diepholz (DE); Ludger Rake, Steinfeld (DE); Karsten Strassburg, Hannover (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 89 days.

(21) Appl. No.: 15/535,938

(22) PCT Filed: Nov. 18, 2015

(86) PCT No.: PCT/EP2015/076896
§ 371 (c)(1),
(2) Date: Nov. 20, 2017

(87) PCT Pub. No.: WO2016/096290
PCT Pub. Date: Jun. 23, 2016

(65) Prior Publication Data
US 2018/0065547 A1 Mar. 8, 2018

(30) Foreign Application Priority Data
Dec. 17, 2014 (DE) .................. 10 2014 226 146

(51) Int. Cl.
*B60Q 3/14* (2017.01)
*B60K 35/00* (2006.01)
(Continued)

(52) U.S. Cl.
CPC .............. *B60Q 3/14* (2017.02); *B60K 35/00* (2013.01); *F16H 59/02* (2013.01); *F16H 63/42* (2013.01);
(Continued)

(58) Field of Classification Search
CPC ...... B60K 2350/2039; B60K 2350/206; B60Q 3/14
See application file for complete search history.

(56) References Cited

U.S. PATENT DOCUMENTS 5,555,161 A * 9/1996 Roe .................. F16H 63/42
116/202
7,441,913 B2 * 10/2008 Bayersdorfer ...... F16H 59/0278
362/23.11
(Continued)

FOREIGN PATENT DOCUMENTS

DE  10 2004 009 208 A1  9/2005
DE  10 2013 005 886 A1  10/2014
(Continued)

OTHER PUBLICATIONS

International Search Report and Written Opinion of the International Search Authority dated Mar. 9, 2016 in International Application No. PCT/EP2015/076896 (English and German languages) (10 pp.).
(Continued)

*Primary Examiner* — Alexander K Garlen
(74) *Attorney, Agent, or Firm* — Brinks Gilson & Lione (57) ABSTRACT

One general aspect of the present disclosure includes a display device for a vehicle for displaying at least one symbol. The display device may include a translucent cover layer, a symbol layer having a translucent symbol panel for displaying a symbol, and an opaque surface encompassing the symbol panel. A gap may be disposed between the
(Continued)

symbol panel and the cover layer. A waveguide assembly may be included and configured to conduct light onto a side of the symbol panel facing away from the cover layer.

18 Claims, 5 Drawing Sheets

(51) Int. Cl.
    *F16H 59/02*     (2006.01)
    *F16H 63/42*     (2006.01)
    *G09F 13/04*     (2006.01)

(52) U.S. Cl.
    CPC .......... *G09F 13/04* (2013.01); *B60K 2370/20* (2019.05); *B60K 2370/332* (2019.05); *B60K 2370/691* (2019.05); *B60K 2370/6992* (2019.05); *B60K 2370/91* (2019.05); *B60K 2370/98* (2019.05); *F16H 2063/423* (2013.01); *G09F 2013/044* (2013.01); *H01L 2924/0002* (2013.01)

(56) References Cited

U.S. PATENT DOCUMENTS

| | | | | |
|---|---|---|---|---|
| 7,441,931 | B2* | 10/2008 | Bayersdorfer | B60K 35/00 340/815.55 |
| 2003/0226494 | A1* | 12/2003 | Sunaga | B60K 35/00 116/28 R |
| 2008/0203755 | A1* | 8/2008 | Bourgeois-Jacquet | B60K 37/00 296/97.5 |
| 2010/0154261 | A1* | 6/2010 | Bozlo | B60R 13/005 40/541 |
| 2012/0200475 | A1 | 8/2012 | Baker et al. | |
| 2012/0218097 | A1* | 8/2012 | Woo | F16H 63/42 340/456 |
| 2012/0281423 | A1* | 11/2012 | Wippler | B60K 35/00 362/489 |
| 2014/0098516 | A1* | 4/2014 | An | G02B 6/0011 362/23.17 |
| 2015/0158423 | A1* | 6/2015 | Schwantner | B60K 35/00 362/23.01 |
| 2015/0210226 | A1* | 7/2015 | Topart | B60R 13/02 362/511 |
| 2015/0314725 | A1* | 11/2015 | Salter | H05B 37/0218 362/510 |
| 2015/0329042 | A1* | 11/2015 | Araki | B60K 35/00 362/97.1 |

FOREIGN PATENT DOCUMENTS

| | | |
|---|---|---|
| EP | 2 492 143 A1 | 8/2012 |
| FR | 2 913 135 A1 | 8/2008 |
| WO | WO 2008/061786 A1 | 5/2008 |

OTHER PUBLICATIONS

German Office Action dated Sep. 30, 2015 for German Application No. DE 10 2014 226 146.5 dated Sep. 30, 2015 (9 pp.).

* cited by examiner

DISPLAY DEVICE FOR DISPLAYING AT LEAST ONE SYMBOL, SWITCHING DEVICE, AND METHOD FOR MANUFACTURING A DISPLAY DEVICE

CROSS REFERENCE TO RELATED APPLICATIONS

This application is a filing under 35 U.S.C. § 371 of International Patent Application PCT/EP2015/076896, filed Nov. 18, 2015, and claims the priority of German Patent Application 10 2014 226 146.5, filed Dec. 17, 2014.

TECHNICAL FIELD

The present disclosure relates to a display device for a vehicle for displaying at least one symbol, a shifting device for shifting a vehicle transmission, and a method for producing a display device for a vehicle for displaying at least one symbol.

BACKGROUND

A display device can be placed in a vehicle, for example, in order to show a driver a current gear setting of the vehicle by means of a luminescent symbol.

DE 10 2004 009 208 A1 describes a corresponding lighting system for displays in vehicles.

Based on this, the present disclosure teaches an improved display device for a vehicle for displaying at least one symbol, an improved shifting device for shifting a vehicle transmission, and an improved method for producing a display device for a vehicle for displaying at least one symbol according to the independent Claims. Advantageous designs can be derived from the dependent Claims and the following description.

BRIEF SUMMARY

A symbol that is to be displayed by a display device can be displayed by illuminating a symbol panel with light. The light can be provided, for example, using a background light, and conducted to the symbol panel via a light well or a wave guide. In order to prevent undesired lighting effects, a gap can be disposed between the symbol panel and a translucent cover layer. When the display device is in operation, the illuminated symbol panel is visible through the cover layer in order to display the symbol to a viewer. According to one embodiment, the symbol panel, and thus the symbol, can also be visible to a viewer when the background lighting is switched off.

A display device for displaying at least one symbol may have the following features:
 a translucent cover layer;
 a symbol layer having a translucent symbol panel for a symbol that is to be displayed by the device, and an opaque surface encompassing the symbol panel, wherein the symbol panel is disposed at a spacing to the cover layer formed by a gap; and
 a waveguide assembly, which is designed to conduct light to a side of the symbol panel facing away from the cover layer.

The display device can be used, for example, for a vehicle, e.g. for a shift lever knob for a shifting device for a vehicle transmission. The display device can be used to display one or more symbols. A symbol can be a numeral, a letter, or a pictogram. When the display device is in operation, such a symbol can be illuminated by a background light. The translucent cover layer can be colorless. The translucent cover layer can comprise a hard material coating or a coating for creating the impression of depth. The cover layer can be designed as a plastic coating or a glass layer, and can be perceived as a clear component. The cover layer can form an outer surface of the display device, and thus be exposed to environmental effects. The wave guide assembly can be or comprise a light well according to one embodiment. The light well can be formed by walls of an opaque intermediate component. The light well can be designed as a cylindrical space, which can be closed at one end by the symbol layer and additionally or alternatively by the cover layer. The symbol layer can be disposed inside the light well or spanning the light well, depending on the embodiment. Thus, the surface of the symbol layer can be limited to a diameter of the light well, or it can extend beyond the diameter of the light well. According to one embodiment, the waveguide assembly can be designed as a waveguide, or it can comprise such a waveguide. In this case, the symbol layer can abut a surface of the waveguide. The translucent symbol panel and the translucent surface of the symbol layer can abut one another directly. The symbol panel can correspond to a surface of the symbol that is to be displayed by the display device. The light striking the symbol panel can be generated by a light source, e.g. a light emitting diode. A light path of the light can run from the waveguide assembly through the symbol panel, through the gap, and through the cover layer. Thus, the light can be coupled into the cover layer after passing through the gap. After leaving the cover layer, the light can be perceived by an eye of a viewer of the display device when the display device is in operation. Because of the gap, a feedback of the light from the cover layer toward the symbol panel, or another symbol panel disposed adjacent thereto, can be prevented.

The gap between the symbol panel and the cover layer can be filled with a medium, which prevents the light totally reflected inside the translucent cover layer from passing into the gap. The medium can be a gas or a vacuum, for example. In this manner, it is possible to prevent light beams in the cover layer from striking the symbol panel, and thus causing undesired lighting effects. By way of example, the gap can be filled with air. This can be implemented inexpensively.

The symbol panel can comprise coloring matter. A luminous color of the symbol that is to be displayed can be defined by the coloring matter. The luminous color can represent a color in which the symbol appears for a viewer of the display device. Thus, a colorless film can be used for the cover layer, and an additional tinted intermediate layer is not needed.

The translucent cover layer can be made of a synthetic polymer or a thermoplastic plastic. Such a film is also suitable for creating a curved symbol panel. The cover layer can have a pre-hardened or cured lacquer coating serving as the hard material coating. Such a lacquer coating can be very thin and nevertheless exhibit a very high resistance to scratching.

According to one embodiment, the waveguide assembly can be designed as a light well. The symbol layer can span an opening of the light well. The symbol panel can be disposed entirely in the region of the opening of the light well, and thus be fully illuminated by the light conducted inside the light well. The symbol layer can lie with the translucent surface on an intermediate component forming the light well. If the display device is designed to display numerous symbols, the symbol layer can be designed as an integral component, and span openings of numerous light wells. This enables a simple and inexpensive production of the display device.

By way of example, the symbol layer can be designed as a film. The film can be a single layer or multi-layered film. A single layer film can comprise at least two regions, of which one is translucent, for creating the translucent surface, and one is opaque, for forming the opaque surface. The two regions can differ, for example, in terms of their materials. With a multi-layered film, a base film can be coated with an opaque layer for creating the opaque surface. Such an opaque layer can be a dark, e.g. black, lacquer coating, which can be applied to the base film. With such a lacquer layer it is possible to reliably prevent the passing of light from the symbol layer into the exterior of the symbol panel.

Thus, the opaque surface, and additionally or alternatively, the symbol panel, can have a multi-layered design. A symbol layer designed as a film can be thin and easily processed.

According to one embodiment, the symbol layer can be designed as a planar surface. Such a planar surface, e.g. a planar film, can be easily processed. In this case, the symbol layer can be connected to the cover layer, e.g. in a form fitting manner. In differing from a material bonded connection, with which the cover layer and the symbol layer are connected without a transition, the gap can be formed between the cover layer and the symbol layer with a form fitting connection.

According to one embodiment, the symbol layer can have a bulge encompassing the symbol panel for forming the gap. The symbol layer can extend into the light well in the region of the bulge. The bulge can be understood to be a curved region of the symbol layer. A depression can be formed by the bulge on a side of the symbol layer facing the cover layer, which can have the form of a hollow. The gap can be formed by the space filling the depression. In this manner, an expansion of the gap can be defined by the shape of the bulge. In this case, the symbol layer can be connected in a form fitting or material bonded manner. With a material bonded connection, the symbol layer can be connected to the cover layer in a material bonded manner outside of the bulge.

According to one embodiment, the cover layer can have a clearance lying opposite symbol panel for forming the gap. As a result, the size of the gap can be readily defined. In this case, the symbol layer can again be connected to the cover layer in a form fitting or material bonded manner. With a material bonding, the symbol layer can be connected to the cover layer in a material bonded manner outside the clearance.

According to another embodiment, the symbol layer can be disposed on a surface of the waveguide facing the cover layer. A very good conducting of the light to the symbol panel can be ensured through the use of the waveguide. The light can be subjected to total reflection on the side walls of the waveguide. The waveguide can be disposed in a light well according to one embodiment. Alternatively, the waveguide can be free standing.

When the symbol layer is disposed on the waveguide, a spacing layer can be disposed between the cover layer and the opaque surface of the symbol layer to form the gap. At least one region lying opposite the symbol panel can be cut out of the spacing layer. In this manner, the gap can be readily produced using the spacing layer. The spacing layer can be formed, for example, by a film or a lacquer layer.

A light source can be disposed on an end of the waveguide assembly for emitting the light. The light source can be designed to emit light in a spectral range that is visible to the human eye. The light can be a white light or a light having a color other than white. The light source can be disposed in the specified light well, or an opening lying opposite the light well.

The display device can be used to display numerous symbols. By way of example, two, three, or more symbols can be displayed. A number of symbol panels corresponding to the number of symbols that are to be displayed can be provided for this. Thus, the symbol layer can have at least one further translucent symbol panel for at least one further symbol that is to be displayed by the display device. The symbol layer can be a single piece, or composed of numerous pieces thereby. The at least one further symbol panel can be encompassed by the opaque surface or another opaque surface, and disposed at a spacing to the cover layer by the gap, or a further gap. A least one further waveguide assembly can be provided in order to conduct further light to a side of the at least one further symbol panel facing away from the cover layer. In this manner, two or more symbols can be displayed adjacently by the display device.

The display device can be used, by way of example, in conjunction with a shifting device for shifting a vehicle transmission. A corresponding shifting device, e.g. a shift lever, can have a corresponding display device, e.g. for displaying a gear setting of the vehicle transmission, using the at least one symbol. The display device can be implemented with a low overall thickness, and as a result, is suitable for use in a shifting device. Furthermore, the display device can be designed with a curved cover layer, such that the display device can also be used to form a curved outer surface.

A method for producing such a display device for a vehicle may comprise the following steps:
provision of a translucent cover layer, a symbol layer having a translucent symbol panel for a symbol that is to be displayed by the display device, and an opaque surface encompassing the symbol panel, as well as a waveguide assembly; and
combining of the cover layer, the symbol layer and the waveguide assembly, wherein the symbol panel is disposed at a spacing to the translucent cover layer by means of a gap, and the waveguide assembly is disposed such that it conducts light onto a side of the symbol panel lying opposite the cover layer.

In the combining step, individual elements of the display device can be connected to one another in a form fitting manner, and additionally or alternatively, material bonded to one another. A laser welding process can also be used thereby.

BRIEF DESCRIPTION OF THE DRAWINGS

The present embodiments shall be explained in greater detail based on the attached drawings. Therein.

DETAILED DESCRIPTION

In the following description of preferred exemplary embodiments, the same or similar reference symbols are used for the elements depicted in the various figures having similar functions, wherein there shall be no repetition of the description of these elements.

Figure 1:
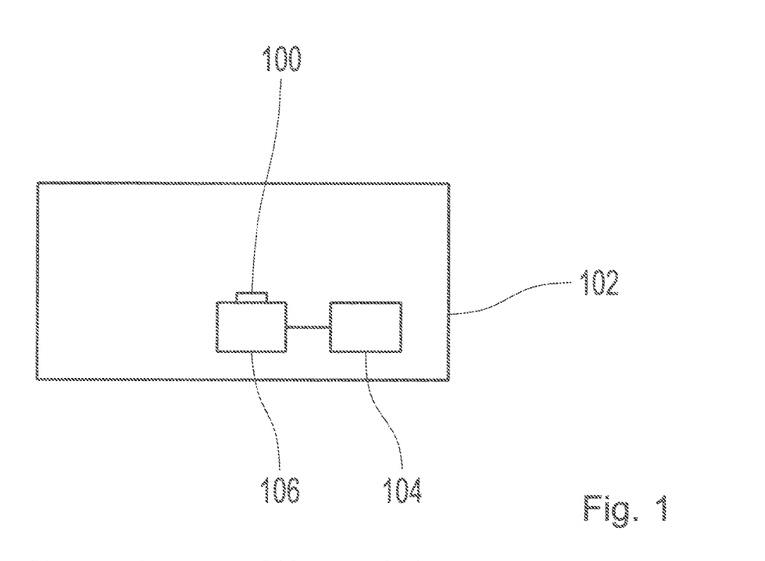
FIG. 1 shows a schematic illustration of a vehicle having a display device for displaying at least one symbol.

FIG. 1 shows a schematic illustration of a display device 100 for displaying at least one symbol according to an exemplary embodiment of the present disclosure. By way of example, the display device 100 is disposed in a vehicle 102, e.g. a passenger car. The vehicle 102 has a transmission 104 and a shifting device 106 for shifting the transmission. A driver of the vehicle 102 can set different gear settings, e.g. different gears or different operating modes of the transmission 104 of the vehicle 102, for example, via the shifting device 106. The display device is designed to display the different gear settings that can be set to the driver by means of the symbols. By way of example, the display device 100 can be disposed on a shift lever or shifting device 106 for this. In order to set a gear setting, the driver can guide the shift lever into a shift gate dedicated to the gear setting, for example.

According to one exemplary embodiment, the display device 100 is designed as a multi-component symbol insert, or a multi-component display. The display device 100 can be used as a component that can be illuminated, e.g. on a shift lever, e.g. in the gearshift knob, in order to display the shift gate (P, R, N, D/S, +, −, etc.) that has been engaged.

The display device 100 can also be used in conjunction with other components of a vehicle 102. Furthermore, the display device 100 can also be used for applications outside of the automotive field, e.g. in building technology.

Figure 2:
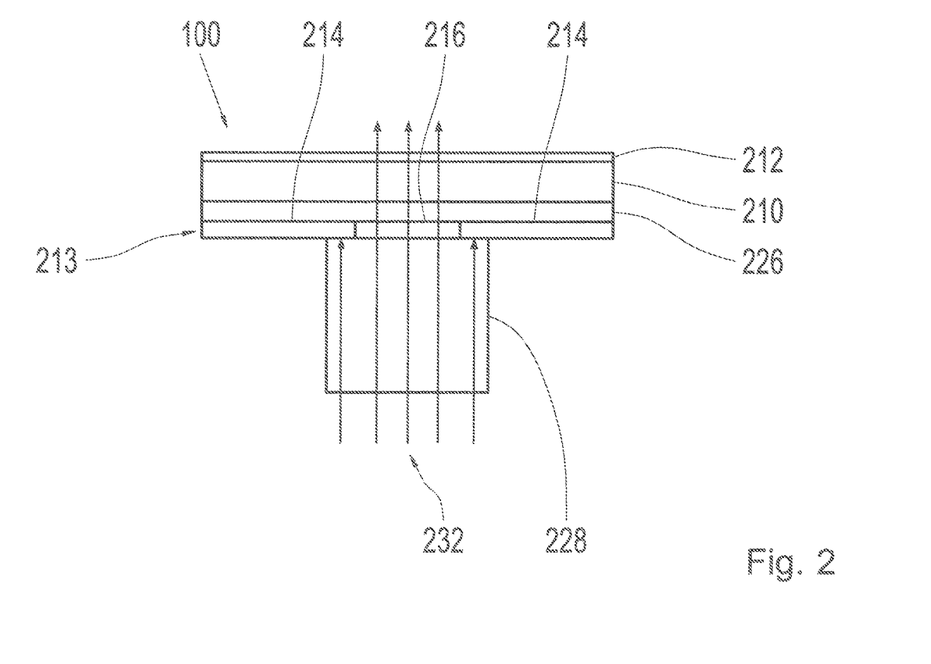
FIG. 2 shows a schematic illustration of a display device for displaying at least one symbol.

FIG. 2 shows a schematic illustration of a display device 100 for displaying at least one symbol according to an exemplary embodiment of the present disclosure. The display device 100 is shown in a cross sectional view. The display device 100 is designed to display a symbol. The display device 100 can be expanded in order to display numerous symbols, e.g. as described on the basis of FIG. 1, numerous symbols for displaying different shifting settings of a shift lever.

The display device 100 has a translucent cover layer 210. Optionally, the cover layer 210 has a translucent hard material coating 212 on one side, which represents the visible surface of the display device 100 for a viewer of the display device 100, by means of which the display device 100 can be protected against damage, e.g. scratches. A symbol layer 213 is disposed on a back surface, thus a side of the cover layer 210 facing away from the viewer when the display device 100 is in the installed state. The symbol layer 213 comprises a region formed as an opaque surface 214, and a region formed as a translucent symbol panel 214. The symbol panel 216 defines a panel for the symbol that is to be displayed by the display device 100. The symbol panel 216 is encompassed by the opaque surface 214.

A gap 226 is disposed between the symbol panel 216 and the cover layer 210. The gap 226 can be designed, for example, as an air gap, which is filled entirely with air. According to various exemplary embodiments, the gap can comprise a surface corresponding to the symbol panel 216, and that is flush with the symbol panel 216, or it can comprise a surface that overlaps symbol panel 216 entirely, and extends over the boundaries of the symbol panel 216, and thus, at least partially overlaps the opaque surface 214.

Thus, the display device 100 has a layered structure composed of the symbol layer 213, the gap 226, and the cover layer 210. The thickness of the gap 226 is less than the thickness of the symbol layer 214 and the thickness of the symbol layer 213 is in turn less than the thickness of the cover layer 210, according to one exemplary embodiment.

A waveguide assembly 230 is disposed on a side of the symbol panel 216 facing away from the gap 226. The waveguide assembly 230 is used for conducting light 232 to the symbol panel 216.

The light 232, which can be provided by an appropriate light source, successively passes through the waveguide assembly 230, the symbol panel 216, the gap 226, the cover layer 210, and if applicable, the optional coating 212, and can then be seen by a viewer. The light 232 is delimited by the opaque surface 214, such that a light beam formed by the light 232 after passing through the symbol panel 216 has a cross sectional surface corresponding to the symbol panel 21, by means of which the symbol that is to be displayed to the viewer is visually depicted. Such a light source can be provided as a component of the display device 100, or it can be provided separately.

The cover layer 210 and the symbol panel 216 are colorless and transparent according to this exemplary embodiment. Alternatively, the cover layer 210 and/or the symbol panel 216 can be tinted, in order to be able to display the symbol in a desired color, for example.

According to various exemplary embodiments, the waveguide assembly 228 can be designed as a light well, thus a space filled with a gas, for example, or as a waveguide, thus as an optical fiber.

The symbol panel 216 can be illuminated by the light 232 when the display device 100 is in an operating mode, such that the symbol panel 216 appears as a self-illuminating surface depicting the symbol for a viewer of the display device 100. In an inactive operating mode, in which the light 232 is not provided, the symbol panel 216 can nevertheless be seen by the viewer as a surface that depicts the symbol, due to the ambient light striking the display device 100 from the exterior. Alternatively, the display device 100 can be designed such that the symbol panel 216, and thus the symbol, cannot be seen without illumination from the light 232.

According to this exemplary embodiment, the cover layer 210 has a planar design. Alternatively, the cover layer 210, and optionally the symbol panel 216 as well, can have a curved design.

Advantageously, the described application enables a prevention of light bleeding in the display device 100 in the manner of a backlit display.

Figure 3:
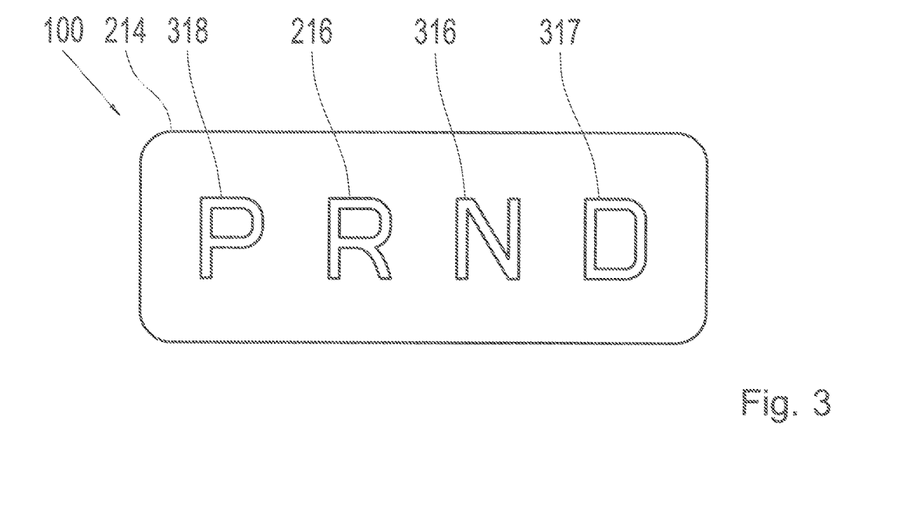
FIG. 3 shows a top view of a display device for displaying at least one symbol.

FIG. 3 shows a top view of a display device 100 for displaying at least one symbol according to an exemplary embodiment of the present disclosure. A surface of the display device 100 visible to a viewer of the display device 100 has a substantially rectangular shape thereby, for example, having rounded corners. The display device 100 is shown in a state without backlighting.

The display device 100 has four symbols that are to be displayed, formed by a symbol panel 216 for depicting a symbol "R," a symbol panel 316 for depicting a symbol "N," a symbol panel 317 for depicting a symbol "D," and a symbol panel 318 for depicting a symbol "P."

For the viewer, the opaque coating 214 of the display device 100 is seen as being a dark, in this case black, surface. The symbol panels 216, 316, 317, 318 are excluded from the opaque coating 214. The light, in this case white, diffusion elements under the symbol panels can be seen through the cut-outs in the opaque coating forming the symbol panels 216, 316, 317, 318.

If the symbol panel 216 is backlit, for example, as is depicted in FIG. 2, then the symbol panel 216 is illuminated from the perspective of a viewer, and the symbol "R" depicted by the symbol panel 216 can be clearly seen by the viewer.

According to one exemplary embodiment, all of the symbols of the display device 100, e.g. "P," "R," "N," and "D" are illuminated. If a gear is engaged with the shift lever for the application example, this is made clear by a clearly brighter illumination of the symbol representing the gear, using an LED (spot lighting), for example.

With the use of the gap, it is possible to prevent the symbols from appearing to be inhomogeneous through a bleeding of the basic lighting with a spot lighting and basic lighting having the same color. With different colors of the spot lighting and basic lighting, there is no color distortion of the symbols illuminated with the basic lighting as a result of the prevention of this light bleeding.

Figure 4:
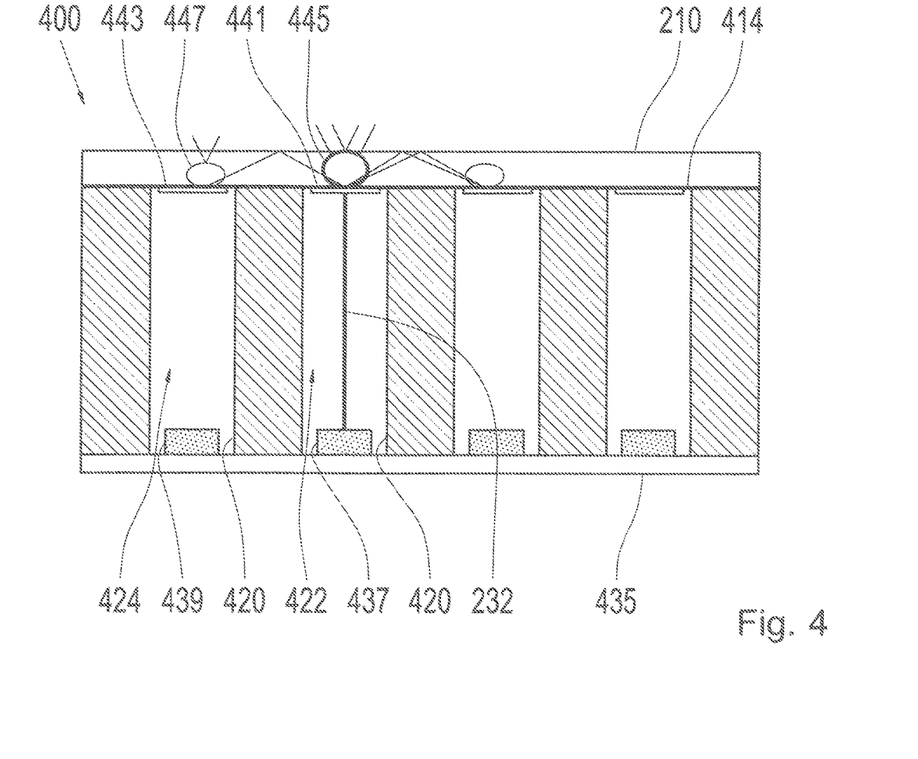
FIG. 4 shows a schematic illustration of a display device for displaying at least one symbol.

FIG. 4 shows a schematic illustration of the display device 400 for displaying at least one symbol. The illustrated display device 400 is designed to display four symbols.

The display device 400 has a translucent cover layer 210, on the undersurface of which an opaque coating 414 is disposed, having cut-outs in the regions of the symbol panels for depicting the symbols. An opaque intermediate component 420 is applied to a surface of the opaque coating 414 facing away from the cover layer 210. The intermediate component 420 has a cut-out for the formation of each of four light wells 422, 424, of which only the two depicted on the left are provided with reference symbols, in the region of each of the symbol panels. The intermediate component 220 is disposed between the opaque coating 414 and a printed circuit board 435 having light sources 437, 439 of the display device. The symbol panels are each covered by a tinted layer 441, 443, of which only the two depicted on the left are provided with reference symbols.

The light source 437 disposed in the light well 424 is shown in operation. The light source 437 is designed to emit light 232. The light 232 strikes the tinted layer 441 and generates a beam characteristic 445 for displaying a symbol inside the cover layer 210. A portion of the light conveyed by the tinted layer 441 into the cover layer 210 is reflected on an outer surface of the cover layer 210, and strikes the adjacent tinted layer 443, for example, of the adjacent tinted layer 443 of the light well 422 disposed adjacently to the light well 224, by means of which an undesired beam characteristic 447 is generated.

According to one exemplary embodiment, the cover layer 210 is made of poly(methyl methacrylate) (PMMA) or polycarbonate (PC). The opaque coating 414 can be a lacquered PC or PMMA film. The tinted layers 441, 443 can be a white lacquer coating. The printed circuit board 435 can be a printed circuit board 435 having light emitting diodes serving as the light sources 437, 449.

With a display and symbol insert application having a "depth effect," in which the symbols that are to be displayed are depicted beneath a PMMA or PC coating having a maximum thickness of ca. 1.5 mm, a ca. 0.25 mm thin PC film is first painted black, the desired symbols are then cut out with a laser, and subsequently, the symbol panels depicting the symbols are then painted white. This film is then shaped, and sprayed with a PMMA for the glass optics or the depth effect. These symbols are then individually spot lit or illuminated with a basic lighting.

If a symbol panel is depicted with a spot lighting, this brighter illumination can bleed into the adjacent white symbols. This results from the display or symbol insert. If the light directed toward the white symbols strikes here, the light beams are conducted further into the PMMA or PC layer 210 lying above in a wide beam angle (Lambertian beam characteristic). Due to the total reflection, the light can travel inside this "glass layer" 210 as far as the adjacent symbols. If these already weakened light beams strike the adjacent symbols, these beams are reflected back in a nearly Lambertian manner due to the physical properties of the white lacquer, and are added in these regions to the basic lighting, as is shown in FIG. 4.

In order to prevent the light from reaching the white symbols or lacquer 441, 443 through total inner reflection, an air gap is disposed between the white and the transparent material (PC or PMMA). As a result, the light directed through total reflection is conducted further, and not reflected on the white material (lacquer or other material) 441, 443 in a Lambertian manner toward the viewer.

One possibility for achieving this is obtained in preventing the bleeding using a diffusor, and without a white undercoating. Another possibility, as has already been shown based on FIG. 2, shall be explained in detail based on the following exemplary embodiment.

Figure 5:
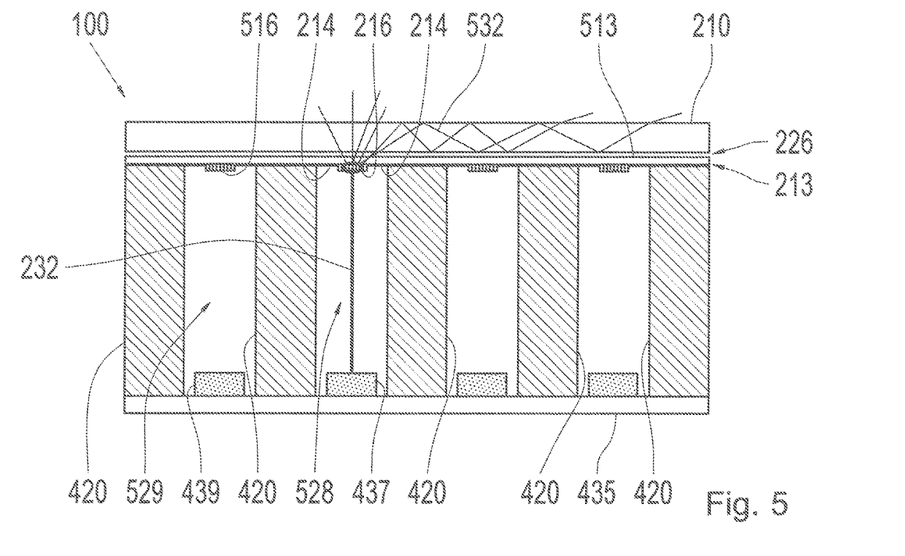
FIG. 5 shows a schematic illustration of a display device for displaying at least one symbol.

FIG. 5 shows a schematic illustration of a display device 100 for displaying at least one symbol according to an exemplary embodiment of the present disclosure. This exemplary embodiment can be an exemplary embodiment such as that described on the basis of FIG. 2.

The display device 100 is designed to display, by way of example, four symbols, wherein the assemblies of the display device 100 for displaying one of the symbols shall be described in greater detail below. The assemblies of the display device 100 used for displaying the further symbols have a corresponding structure.

The display device has a translucent cover layer 210, a symbol layer 213 and a gap 226 disposed between the symbol layer 213 and the cover layer 210. The symbol layer 213 comprises a region implemented as an opaque surface 214, and a region implemented as a translucent symbol panel 216 for depicting the symbol described above. The symbol panel 216 is encompassed by the opaque surface 214. The symbol layer 213 has an optional backing layer 513 according to this exemplary embodiment, to which an opaque layer is applied to form the opaque surface 214 and a translucent layer is applied to form the symbol panel 216. The backing layer 513 is disposed on the side of the symbol layer 213 facing the gap 226.

According to one exemplary embodiment, at least the surface of the symbol layer 213 facing the gap 226 is designed as a planar surface. The symbol layer 213 can be formed by a coated film thereby.

According to this exemplary embodiment, the display device 100 has a waveguide assembly designed as a light well 528. The light well 528 is closed at one end by the symbol layer 213 and at the other end by a mount 435. The light well 528 can have a cylindrical design, and has a longitudinal extension direction which is orthogonal to the cover layer 210 according to this exemplary embodiment. Walls of the light well 528 are formed by an intermediate component 420, which is disposed between the symbol layer 213 and the mount 435. The light well 528 can thus be a through hole in the intermediate component 420.

A light source 437 is disposed on the mount 435. According to this exemplary embodiment, the light source 437 is disposed on a surface of the mount 435 inside the light well 528. The light source 435, e.g. a light emitting diode or other suitable light source, is designed to emit light 232 toward the symbol layer 213. Light 232 striking the symbol layer 216 can pass through this, for example, and subsequently passes through the backing layer 513, the gap 226 and the cover layer 210, as has already been described in reference to FIG. 2. In contrast, light striking the opaque surface 214 is absorbed or reflected by the opaque surface 214.

Corresponding to the described assembly composed of a light source 437, light well 528, symbol panel 216 with an encompassing opaque surface 214, as well as a gap 226 and a cover layer 210, disposed behind it in the beam direction of the light, the display device 100 has a further assembly for displaying a further symbol, which is dispose on the left, adjacent to the described assembly in the illustration in FIG. 5, and has a further light source 439, a further light well 529, and a further symbol panel 516 having the encompassing opaque surface 214. In the beam direction of the light that is transmitted by the further light source 439, the gap 226 and the cover layer 210 are disposed behind the symbol panel 516. To display two further symbols, the display device has two more assemblies implemented in the same manner, which are not provided with reference symbols in FIG. 5 for purposes of clarity. The intermediate component 420 serves to delimit the individual light wells of the individual assemblies. The cover layer 210, the gap 226 and the symbol layer 213 extend continuously over the four light wells. Alternatively, at least the gap 226 can have interruptions between the light wells 528, 529.

According to one exemplary embodiment, the cover layer is made of poly(methyl methacrylate) (PMMA) or polycarbonate (PC). The gap 226 is designed as an air gap. The backing layer 513 is implemented in the form of a PC or PMMA film. The opaque surface 214 is implemented in the form of an opaque lacquer, and the symbol panel 216 is implemented in the form of a translucent lacquer on the backing layer 513. The symbol panel 216 has a beam characteristic, through which the light 232 striking the symbol panel 216 is diffused. Reflected light beams 532 of the light 232, which do not pass through the cover layer 210 after leaving the symbol panel 216, but rather, are reflected on the outer surface of the cover layer 210, are again reflected on the transition surface between the cover layer 210 and the gap 226, such that they do not exit into the gap 226.

In differing from the display device illustrated in FIG. 4, according to the display device described on the basis of FIG. 5, a bleeding into the adjacent symbols can be prevented, in that the symbol panels 216, 516 are separated from the clear component in the form of the cover layer 210. According to one exemplary embodiment, the symbol layer 213 in the form of a film lacquered on the back is used for this, to which an opaque lacquer is applied to form the surface 214, and a translucent, optionally tinted, lacquer is applied to form the symbol panel 216, which depicts specific symbols in conjunction therewith. By way of example, symbols for the shift lever positions P, R, N and D can be depicted. The cover layer 210 in the form of a transparent component (PC or PMMA) is placed on the symbol layer 213 in the form of the film, and can be connected thereto in a form fitting manner. Because the connection according to one exemplary embodiment is not a material bonding in this case, the bleeding effect can be prevented by the air gap 226 resulting thereby. The light beams no longer have the possibility of striking the translucent lacquer of the adjacent symbols forming the symbol panel 216, due to the total reflection, such that bleeding effects can no longer be observed.

The cover layer 210 in the form of the transparent component has no structure in the regions of the symbols (eroding structure, etc.), in order to not disrupt the propagation of the light beams. Otherwise, this would result in a deflection of the light beams that would be visible to the human eye. In order to obtain the effect of total reflection, the surface of the transparent component is glossy (highest possible gloss).

The light beams located in the material of the cover layer 210 are deflected by this total reflection, and are thus not visible to the viewer. These slowly become entirely lost thereby, and no bleeding occurs.

Figure 6:
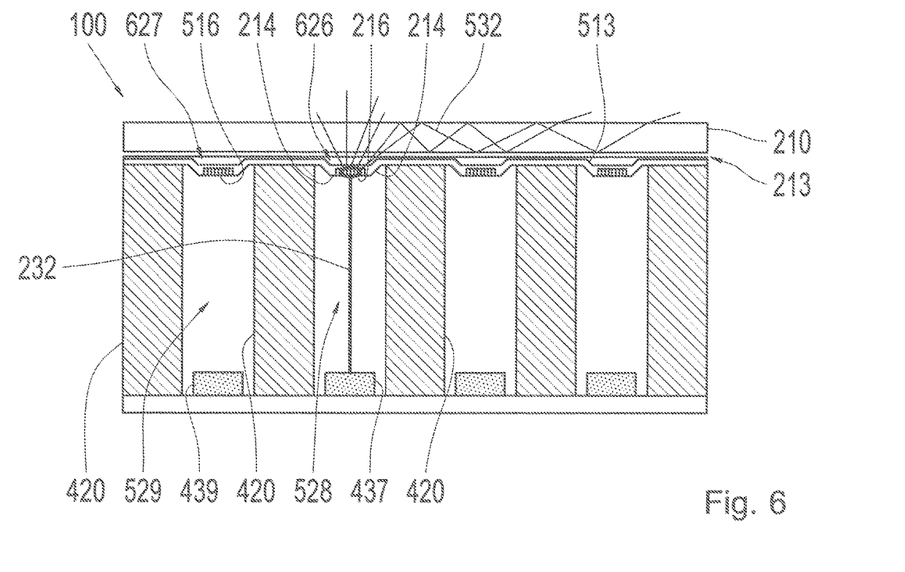
FIG. 6 shows a schematic illustration of a display device for displaying at least one symbol.

FIG. 6 shows a schematic illustration of a display device 100 for displaying at least one symbol according to an exemplary embodiment of the present disclosure. The display device 100 corresponds to the display device shown on the basis of FIG. 5, with the difference that the symbol layer 213 bulges in each case into the light wells 528, 529 in the regions of the symbol panels 216, 516, and is connected directly to the cover layer 210 outside the bulges, e.g. lying on the cover layer 210. As a result, the display device 100 does not have a gap extending over the entire surface of the cover layer 210, but rather, has a separate gap 626, 627 for each symbol panel 215, 516. The bulges of the symbol layer 213 each have a sloped edge region, and a region encompassed by the edge region running parallel to the adjacent cover layer 210, in which a symbol panel 216, 516 is disposed in each case. The gaps 626, 627 are formed by the hollows formed by the bulges.

According to one exemplary embodiment, a film forming the symbol panel 213 is shaped such that it forms an air gap 626, 627 in each case in the region of the symbols. The connection between the intermediate component 420 forming the light wells 528, 529, the film forming the symbol panel 213 and the cover layer 210 formed by a clear component can be a form fitting and/or material bonded connection in this case, e.g. through adhesive or suchlike. Alternatively to a form fitting and/or material bonded connection, laser welding processes can be used here and in the other exemplary embodiments.

Figure 7:
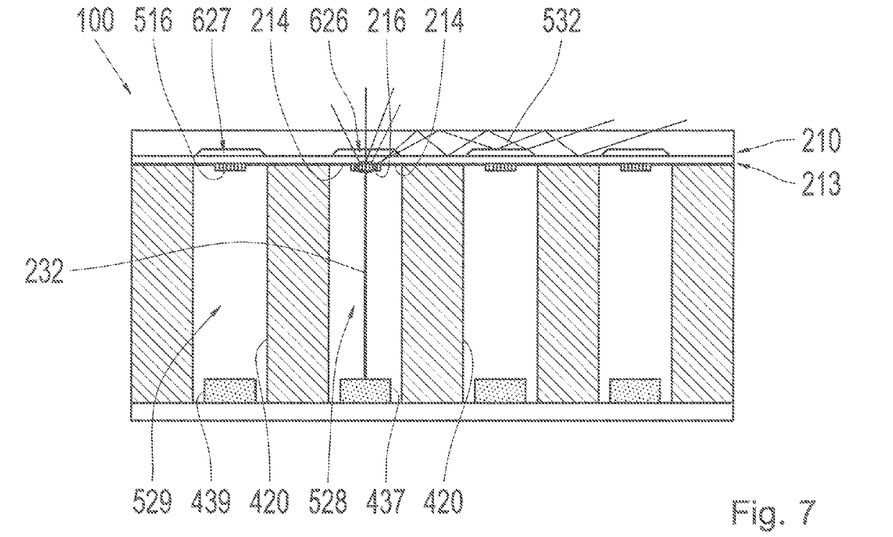
FIG. 7 shows a schematic illustration of a display device for displaying at least one symbol.

FIG. 7 shows a schematic illustration of the display device for displaying at least one symbol according to an exemplary embodiment of the present disclosure. The display device 100 corresponds to the display device illustrated in FIG. 5, with the difference that the cover layer 210 lying opposite the symbol panels 216, 516 has a clearance in each case, and is connected directly to the symbol layer 213 outside the clearances. Thus, the display device 100 does not have a gap extending over the entire surface, but rather, has a separate gap 626, 627 for each symbol panel 215, 516. The clearances in the cover layer 210 each have a sloped edge region, and a region encompassed by the edge region running parallel to the symbol layer 213, having one of the symbol panels 216, 516 disposed opposite thereto in each case. The gaps 626, 627 are formed by the hollows formed by the clearances. The clearances could also be formed indirectly through encompassing rises in the surface of the cover layer 210.

According to one exemplary embodiment, corresponding slight rises are formed in the cover layer 210 implemented as a clear component, having the advantage that the symbol layer 213, e.g. in the form of a film, does not have to be deformed, and moreover, a similar effect to that in the exemplary embodiment described on the basis of FIG. 6 is obtained. Here as well, the connection between the light well 528, 529, symbol layer 213 and cover layer can occur in a form fitting or material bonded manner (adhesive, etc.).

Figure 8:
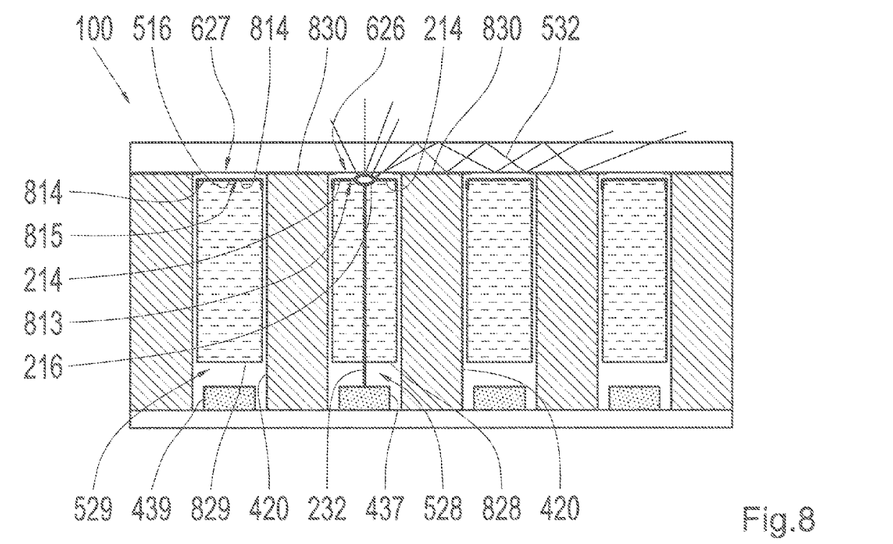
FIG. 8 shows a schematic illustration of a display device for displaying at least one symbol.

FIG. 8 shows a schematic illustration of a display device 100 for displaying at least one symbol according to an exemplary embodiment of the present disclosure. The display device 100 corresponds to the display device shown in FIG. 5, with the difference that one waveguide 828, 829 is disposed in each of the light wells 528, 529, and one symbol layer 813, 815 is disposed on the ends of each of the waveguides 828, 829 facing the cover layer 210. The symbol layers 813, 815 each have a translucent symbol panel 216, 516, and the opaque surfaces 214, 814 encompassing the symbol panels. Instead of a gap extending over the entire surface, a separate gap 626, 627 is formed opposite each of the symbol panels 216, 516, between the symbol panels 216, 516 and the cover layer 210. According to this exemplary embodiment, the gaps 626, 627 are formed by a spacing layer 830, disposed between the cover layer 210 and the intermediate component 420, having excesses extending into the light wells 528, 529, functioning as a spacer for waveguides 828, 829, with the symbol layers 813, 815, adjacent to the spacing layer 830. In order to form the gaps 626, 627, the spacing layer 820 has through holes lying opposite the symbol panels 216, 516 for shaping the gaps 626, 627.

According to one exemplary embodiment, the spacing layer 830 is implemented as an opaque lacquer, or a lacquered PC or PMMA film, having a stripped area in each case in the region of the gaps 626, 627, thus without lacquer or suchlike. The waveguides 828, 829 can each be implemented as films with a symbol or lacquer applied to the back.

According to one exemplary embodiment, the spacing layer 830 in the form of an opaque lacquer or a film (2 components), having cut-outs in the form of windows or stripped areas, is applied to the cover layer 210 having the form of a clear component. One waveguide 828, 829 is applied to, pressed onto, etc. each of these cut-outs, each having the symbol layer 813, 815 on the surface, e.g. in the form of a film, which is provided with opaque lacquer and translucent lacquer (for the symbol). Because there is not a material bonded connection here between the white lacquer, e.g. for the symbol panels 216, 516 and the cover layer 210 in the form of the clear component (air between the waveguides 828, 829 and the cover layer 210), the light bleeding is likewise prevented.

Figure 9:
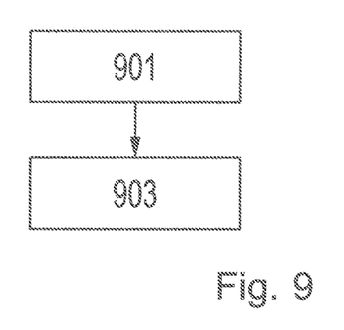
FIG. 9 shows a flow chart of a method for producing a display device.

FIG. 9 shows a flow chart for a method for producing a display device for displaying at least one symbol according to an exemplary embodiment of the present disclosure. By way of example, a display device, such as that described above based on the Figures, can be produced using the method.

In a step 901, the individual components of the display device, e.g. a translucent cover layer, a symbol layer having a translucent symbol panel, and an opaque surface encompassing the symbol panel, as well as a waveguide assembly, are provided separately, or already partially combined. In a step 903, the individual components are combined with one another to form the display device. Connecting technologies for creating form fitting and/or material bonded connections can be used thereby.

The exemplary embodiments described herein and shown in the Figures are selected only by way of example. Different exemplary embodiments can be combined with one another, either in their entirety or with respect to individual features.

Furthermore, one exemplary embodiment can be supplemented by features of another exemplary embodiment. If an exemplary embodiment comprises an "and/or" conjunction between a first feature and a second feature, this can be read to mean that the exemplary embodiment has both the first feature as well as the second feature according to one embodiment, and has either just the first feature or just the second feature according to another embodiment.

REFERENCE SYMBOLS 100 display device
102 vehicle
104 transmission
106 shifting device
210 cover layer
212 hard material coating
213 symbol layer
214 translucent surface
216 symbol panel
226 gap
228 waveguide assembly
232 light
316 further symbol panel
317 further symbol panel
318 further symbol panel
400 display device
414 opaque layer
422 light well
424 further light well
435 printed circuit board
437 light source
439 further light source
441 tinted layer
443 further tinted layer
445 beam characteristic
447 further beam characteristic
513 backing layer
516 further symbol panel
528 light well
529 further light well
532 reflected light
626 gap
627 further gap
813 symbol layer
814 further opaque surface
815 further symbol layer
828 waveguide
829 further waveguide
830 spacing layer
901 provision step
903 combination step

We claim:

1. A display device for a vehicle for displaying at least one symbol, comprising:
    a translucent cover layer forming an outer surface of the display device and configured for exposure to environmental effects;
    a symbol layer having a translucent symbol panel for displaying a symbol and an opaque surface encompassing the symbol panel; and
    a waveguide assembly configured to conduct light onto a side of the symbol panel facing away from the cover layer,
    wherein the symbol layer has a bulge that extends away from the cover layer and forms a gap, and wherein the symbol panel is at least partially encompassed by the bulge of the symbol layer such that the symbol panel is located beneath the gap.

2. The display device according to claim 1, wherein the waveguide assembly includes a light well, and wherein the symbol layer spans an opening of the light well.

3. The display device according to claim 1, wherein the symbol layer includes a film.

4. The display device according to claim 1, wherein the symbol layer includes a planar surface.

5. The display device according to claim 1, wherein the cover layer has a clearance lying opposite the symbol panel.

6. The display device according to claim 1, wherein the waveguide assembly includes a waveguide, and wherein the symbol layer is disposed on a surface of the waveguide facing the cover layer.

7. The display device according to claim 6, wherein a spacing layer is disposed between the cover layer and the opaque surface of the symbol layer.

8. The display device according to claim 1, wherein a light source for emitting the light is disposed on an end of the waveguide assembly facing away from the symbol panel.

9. The display device according to claim 1, wherein at least one of the symbol layer and a second symbol layer has a second translucent symbol panel for displaying a second symbol, wherein the second symbol panel is encompassed by at least one of the opaque surface and a second opaque surface, and wherein the display device includes a second waveguide assembly for conducting light to a side of the second symbol panel facing away from the cover layer.

10. A shifting device for shifting a vehicle transmission, wherein the shifting device has a display device according to claim 1 for displaying an operating stage of the vehicle transmission, using the at least one symbol.

11. A method for manufacturing a display device for a vehicle for displaying at least one symbol, the method comprising:

combining a cover layer, a symbol layer having a translucent symbol panel for displaying a symbol, and a waveguide assembly, wherein the waveguide assembly is disposed such that it conducts light onto a side of the symbol panel facing away from the cover layer, and wherein the cover layer forms an outer surface of the display device and configured for exposure to environmental effects, wherein the symbol layer has a bulge that extends away from the cover layer and forms a gap, and wherein the symbol panel is at least partially encompassed by the bulge of the symbol layer such that the symbol panel is located beneath the gap.

12. The method according to claim 11, wherein the waveguide assembly includes a light well, and wherein the symbol layer spans an opening of the light well.

13. The method according to claim 11, wherein the symbol layer includes a film.

14. The method according to claim 11, wherein the symbol layer includes a planar surface.

15. The method according to claim 11, wherein the cover layer has a clearance lying opposite the symbol panel.

16. The method according to claim 11, wherein the waveguide assembly includes a waveguide, and wherein the symbol layer is disposed on a surface of the waveguide facing the cover layer.

17. The method according to claim 16, wherein a spacing layer is disposed between the cover layer and an opaque surface of the symbol layer, and wherein the opaque surface encompasses the symbol panel.

18. The method according to claim 11, wherein a light source for emitting the light is disposed on an end of the waveguide assembly facing away from the symbol panel.

* * * * *